(12) United States Patent
Triyoso et al.

(10) Patent No.: US 7,015,153 B1
(45) Date of Patent: Mar. 21, 2006

(54) METHOD FOR FORMING A LAYER USING A PURGING GAS IN A SEMICONDUCTOR PROCESS

(75) Inventors: Dina H. Triyoso, Austin, TX (US); Olubunmi O. Adetutu, Austin, TX (US); David C. Gilmer, Austin, TX (US); Darrell Roan, Austin, TX (US); James K. Schaeffer, Austin, TX (US); Philip J. Tobin, Austin, TX (US); Hsing H. Tseng, Austin, TX (US)

(73) Assignee: Freescale Semiconductor, inc., Austin, TX (US)

( * ) Notice: Subject to any disclaimer, the term of this patent is extended or adjusted under 35 U.S.C. 154(b) by 0 days.

(21) Appl. No.: 10/969,634

(22) Filed: Oct. 20, 2004

(51) Int. Cl.
*H01L 21/31* (2006.01)
(52) U.S. Cl. ........................ 438/785; 438/778
(58) Field of Classification Search ................ 438/778, 438/785; 427/250, 255.29, 255.31, 255.36, 427/569, 576
See application file for complete search history.

(56) References Cited

U.S. PATENT DOCUMENTS

| | | | |
|---|---|---|---|
| 6,456,653 B1 * | 9/2002 | Sayeed | 375/227 |
| 6,825,538 B1 * | 11/2004 | Frank et al. | 257/411 |
| 2004/0224089 A1 * | 11/2004 | Singh et al. | 427/255.27 |
| 2005/0164445 A1 * | 7/2005 | Lin et al. | 438/240 |
| 2005/0170666 A1 * | 8/2005 | Sekine et al. | 438/785 |

OTHER PUBLICATIONS

Nabatame, T. et al.; "Design and Proof of High Quality HfAlO$_x$ Film Formation for MOSCAPs and nMOSFETs through Layer-by-Layer Deposition and Annealing Process"; 2003 Symposium of VLSI Technology Digest of Technical Papers; 2003; 2 pgs.

Onishi, Katsunori et al.; "Effects of High-Temperature Forming Gas Anneal on HfO$_2$ MOSFET Performance"; VLSI, 2002; 2pgs.

Choi, Rino et al.; "Fabrication of High Quality Ultra-thin Hfo$_2$ Gate Dielectric MOSFETs Using Deuterium Anneal"; IEDM 2002; 4 pgs; IEEE.

Rahtu, Antti et al.; "In Situ Mass Spectromery Study on Atomic Layer Deposition from Metal (Ti, Ta, and Nb) Ethoxides and Water"; Chem. Mater 2001; PP 817-823; American Chemical Society; Published on Web.

Mitami, Yuichiro et al; "Highly Reliable Gate Oxide under Fowler-Nordheim Electron Injection by Deuterium Pyrogenic Oxidation and Deuterated Poly-Si Deposition"; IEDM 2000; 4 pgs; IEEE.

Matero, Raija et al.; "In Situ Quadrupole Mass Spectrometry and Quartz Crystal Microbalance Studies on the Atomic Layer Deposition of Titanium Dioxide from Titanium Tetrachloride and Water"; Chem. Mater.; 2001; pp 4506-4511; American Chemical Society; Published on Web.

* cited by examiner

*Primary Examiner*—S. V. Clark
(74) *Attorney, Agent, or Firm*—Joanna G. Chiu; Susan C. Hill

(57) ABSTRACT

A method for forming at least a portion of a semiconductor device includes providing a semiconductor substrate, flowing a first precursor gas over the substrate to form a first metal-containing layer overlying the semiconductor substrate, and after completing said step of flowing the first precursor gas, flowing a first deuterium-containing purging gas over the first metal-containing layer to incorporate deuterium into the first metal-containing layer and to also purge the first precursor gas. The method may further include flowing a second precursor gas over the first metal-containing layer to react with the first metal-containing layer to form a metal compound-containing layer, and flowing a second deuterium-containing purging gas over the metal compound-containing layer to incorporate deuterium into the metal compound-containing layer and to also purge the second precursor gas.

19 Claims, 4 Drawing Sheets

METHOD FOR FORMING A LAYER USING A PURGING GAS IN A SEMICONDUCTOR PROCESS

FIELD OF THE INVENTION

The present invention relates generally to semiconductor device processing, and more specifically, to forming a layer using a purging gas in a semiconductor process.

RELATED ART

The use of dielectric layers having a high dielectric constant (also referred to as high K dielectrics) in transistors have allowed for further transistor scaling. High K gate dielectrics allow for improved gate leakage properties; however, they may suffer from mobility degradation, threshold voltage (Vt) instability, and charge trapping. As technology continues to scale, these issues may prevent further integration of high K dielectrics. Therefore, a need exists for a method of forming high K with improved properties.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Atomic layer deposition (ALD) may be used to form semiconductor layers such as, for example, dielectric layers having a high dielectric constant (also referred to herein as high K dielectrics) or metal-containing layers. Note that, as used herein, a high dielectric constant or high K refers to a dielectric constant greater than the dielectric constant of silicon dioxide, which is approximately 4. In one embodiment, during ALD formation of a high K dielectric, a deuterium-containing purging gas is used to incorporate deuterium into the high K dielectric layer and into any interfacial layers, if present. In one embodiment, during ALD formation of a metal-containing layer, such as, for example, a metal-containing gate over the high K gate dielectric, a deuterium-containing purging gas is used to further incorporate deuterium into the high K dielectric layer, into the metal-containing gate, and into any interfacial layers.

Figure 1:
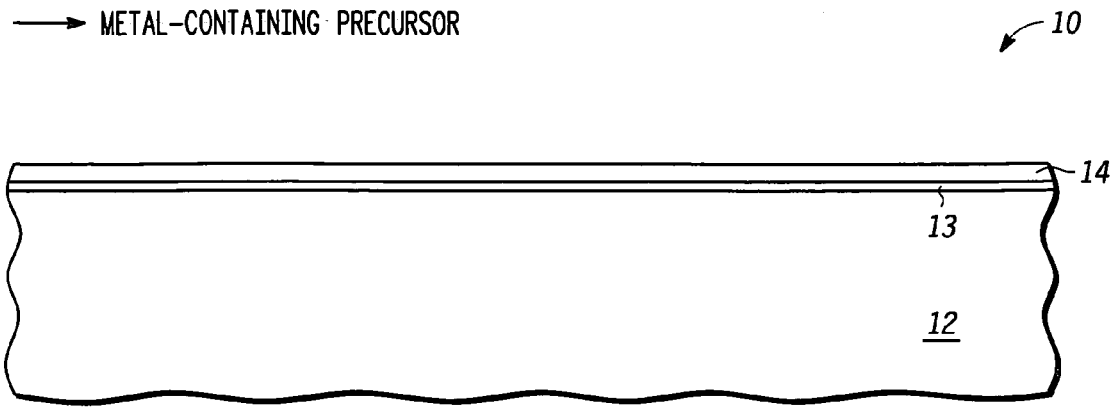
FIGS. 1–4 illustrate, in cross-sectional views, a method for forming a high K dielectric layer in accordance with one embodiment of the present invention.

FIGS. 1–4 illustrate, in cross-sectional views, a method for forming a high K dielectric layer in accordance with one embodiment of the present invention. FIG. 1 illustrates, a cross-sectional view, of a semiconductor device 10. FIG. 1 includes a substrate 12, where, in one embodiment, substrate 12 is any type of semiconductor substrate. In one embodiment, semiconductor substrate 12 may be formed of any semiconductor material, such as, for example, silicon, germanium, silicon germanium, gallium arsenide or the like. Semiconductor substrate 12 may be a bulk substrate or a semiconductor-on-insulator (SOI) substrate including a semiconductor layer (formed of any semiconductor material) overlying an insulating layer (such as, for example, a buried oxide layer) which overlies a support layer (formed, for example, of any type of material which provides support to the insulating layer and semiconductor layer. Note that, in one embodiment, well implants and/or trench isolations (not illustrated in FIG. 1) may be formed within substrate 12.

As illustrated in FIG. 1, substrate 12 is pretreated to form an interfacial layer 13. In one embodiment, resulting interfacial layer 13 is a non-conductive layer including an oxide or a nitride and may be formed in a variety of ways. For example, if substrate 12 is a silicon substrate, then substrate 12 may be pretreated to form a silicon dioxide interfacial layer. This silicon dioxide layer may be thermally grown on substrate 12 or deposited over substrate 12. Alternatively, if substrate 12 is a silicon substrate, it may be pretreated to form other interfacial layers, such as a silicon nitride or a silicon oxynitride layer. Alternatively, no pretreatment may be performed. In this case, interfacial layer 13 would not be present.

After pretreatment to form interfacial layer 13, a first precursor pulsing cycle is performed in which a metal-containing precursor is flowed over substrate 12 to form a metal-containing layer 14 over interfacial layer 13. Note that, in one embodiment, metal from the metal-containing precursor may be incorporated into interfacial layer 13. The metal-containing precursor may include a metal halide, such as, for example, hafnium tetrachloride, which is flowed over substrate 12 to form a hafnium-chloride layer 14 over interfacial layer 13. In alternate embodiments, other metal-containing precursors may be used, such as, for example, metal alkoxides, metal amidos, metal alkyls, etc. Also, the metal included in the metal-containing precursor may include, for example, hafnium, zirconium, silicon, lanthanum, titanium, tantalum, molybdenum, iridium, tungsten, or ruthenium, etc. or combinations thereof.

Figure 2:
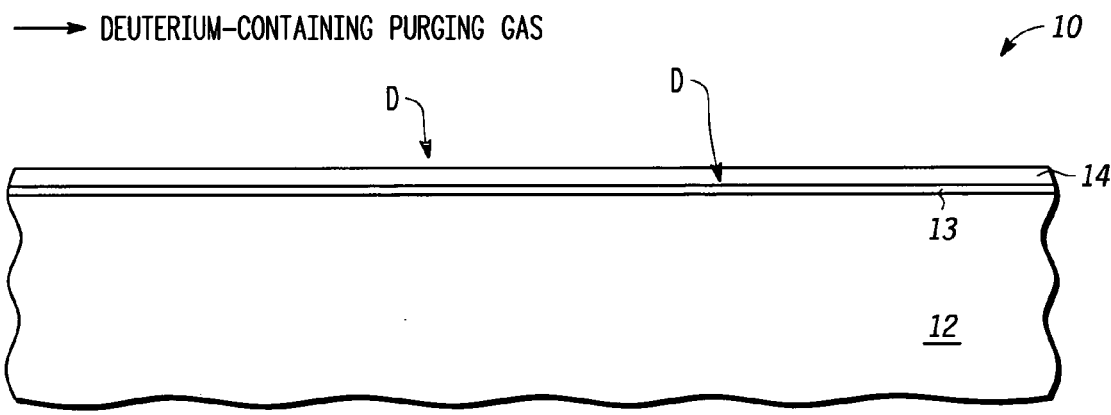

FIG. 2 illustrates the semiconductor device of FIG. 1 during a first purging cycle in which a deuterium-containing purging gas is flowed over metal-containing layer 14. (Note that this first purging cycle is performed after completing the first precursor pulsing cycle.) The purging gas purges the metal precursor by removing any remaining unreacted metal precursor. This purging gas may therefore include, for example, nitrogen, argon, helium, or other inert gases. Alternatively, the purging gas may include hydrogen. As illustrated in FIG. 2, the purging gas also includes deuterium which, during the purge, may be incorporated into metal-containing layer 14, the interface between metal-containing layer 14 and interfacial layer 13, or the interface between interfacial layer 13 and substrate 12, or at a subset or all of these places. In one embodiment, the incorporated deuterium helps to passivate dangling bonds in the various interfaces between layers.

Figure 3:
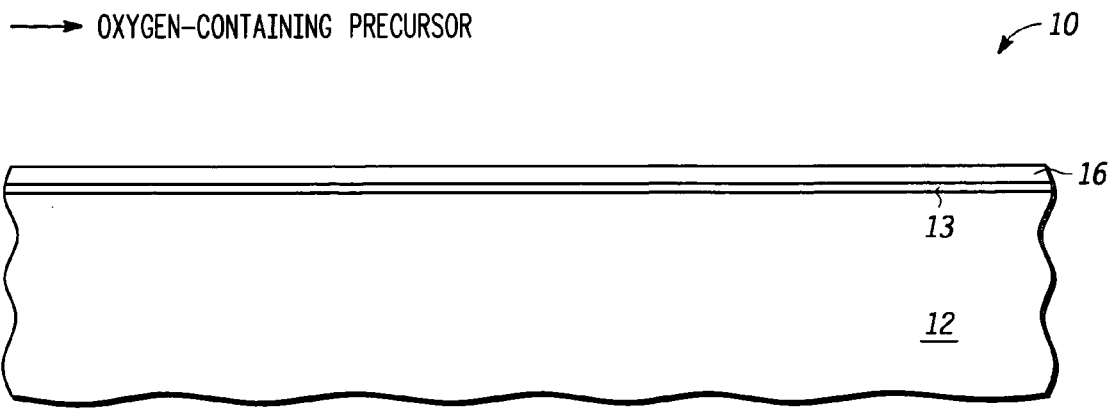

FIG. 3 illustrates the semiconductor device of FIG. 2 during a second precursor pulsing cycle in which an oxygen-containing precursor is flowed over metal-containing layer 14 to form a metal-oxide layer 16. In one embodiment, the oxygen-containing precursor may include, for example, deuterium oxide, deuterium peroxide, hydrogen oxide, hydrogen peroxide, ozone, methane, deuterated methane, ammonia, or deuterated ammonia, or any combination thereof. During this second precursor pulsing cycle, the oxygen in the oxygen-containing precursor reacts with the metal in metal-containing layer 14, thus forming metal-oxide layer 16 and volatile by-products. For example, in the example provided above in which hafnium tetrachloride is used to form metal-containing layer 14 as a hafnium chloride layer, the hafnium in metal-containing layer 14 reacts with the oxygen (thus converting the hafnium tetrachloride layer to a hafnium oxide layer) and the chloride reacts with other portions of the precursor (e.g., the deuterium or hydrogen) to form volatile byproducts (e.g., DCl or HCl, respectively) which may then be removed. Also, if the oxygen-containing precursor includes deuterium, the excess deuterium that is liberated during the reaction may help passivate dangling bonds (such as, for example, Si dangling bonds).

In an alternate embodiment, a nitrogen-containing precursor may used rather than an oxygen-containing precursor, such that a metal nitride layer is formed. Alternatively, other compound-containing precursors may be used, such that resulting layer 16 is a metal compound-containing layer. Note that this metal compound-containing layer may either be conductive or non-conductive.

Figure 4:
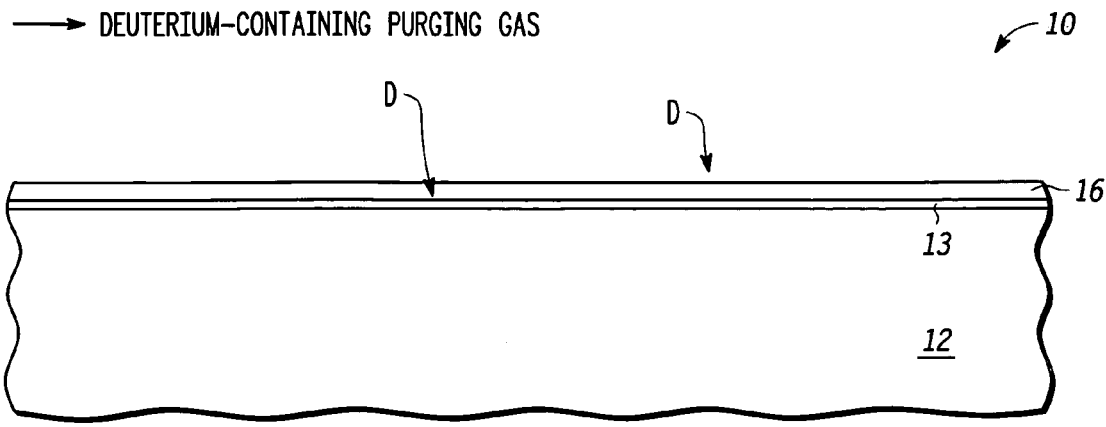

FIG. 4 illustrates the semiconductor device of FIG. 3 during a second purging cycle in which a deuterium-containing purging gas is flowed over metal-oxide layer 16. (Note that this second purging cycle is performed after completing the second precursor pulsing cycle.) The purging gas is used, for example, to remove the volatile by-products created during formation of metal-oxide layer 16. This purging gas may therefore include, for example, nitrogen, argon, or other inert gases. As illustrated in FIG. 4, the purging gas also includes deuterium which, during the purge, may be incorporated into metal-oxide layer 16, the interface between metal-oxide layer 16 and interfacial layer 13, or the interface between interfacial layer 13 and substrate 12, or at a subset or all of these places. In one embodiment, the incorporated deuterium helps to passivate dangling bonds in the various interfaces between layers. Note that in one embodiment, the purging gas used in the second purging cycle of FIG. 4 is the same as the purging gas used in the first purging cycle discussed in reference to FIG. 2.

The pulsing/purging cycles of FIGS. 1–4 may be repeated as many times as necessary until a desired thickness of the final layer (e.g. the high K gate dielectric) is achieved. In one embodiment, this desired thickness is in a range of approximately 1 to 10 nanometers, or, more preferably, 1.5 to 5 nanometers. In an alternate embodiment, the purging gas of the first purging cycle in FIG. 2 may be different from that used in the second purging cycle of FIG. 4. For example, an argon deuterium-containing purging gas may be used for the first purging cycle of FIG. 2, while a nitrogen deuterium-containing purging gas may be used for the purging gas in the second purging cycle of FIG. 4. Note that the use of deuterium in the purging gases allows for an increased amount of deuterium incorporation during formation of a high K dielectric layer. This increased amount of deuterium helps improved passivation which may therefore result in improved reliability of the resulting semiconductor device. Note that in an alternate embodiment, deuterium may be used in only the purging gas of the first or second purging cycles. In this embodiment in which only one of the first or second purging cycles includes deuterium, a lesser amount of deuterium may be incorporated. However, this embodiment may still allow for improved reliability of the resulting semiconductor device.

In one embodiment, after the pulsing and purging cycles of FIGS. 1–4 are repeated the desired number of times, a minimum concentration of deuterium in the resulting metal compound-containing layer is greater than $1.7 \times 10^{20}$ atoms/$cm^3$. Also, in one embodiment, a minimum concentration of deuterium at this point in interfacial layer 13 is greater than $2.6 \times 10^{20}$ atoms/$cm^3$. Note that subsequent processing may affect these concentration numbers.

In an alternate embodiment, during the purging cycles, plasma may also be introduced. For example, the plasma may be introduced during only a portion of a purging cycle. This plasma may help to further enhance deuterium incorporation. Also, in one embodiment, after the precursor/purging cycles of FIGS. 1–4 are performed the desired number of times to achieve a desired final thickness for the high K dielectric layer, an anneal may be performed.

Figure 5:
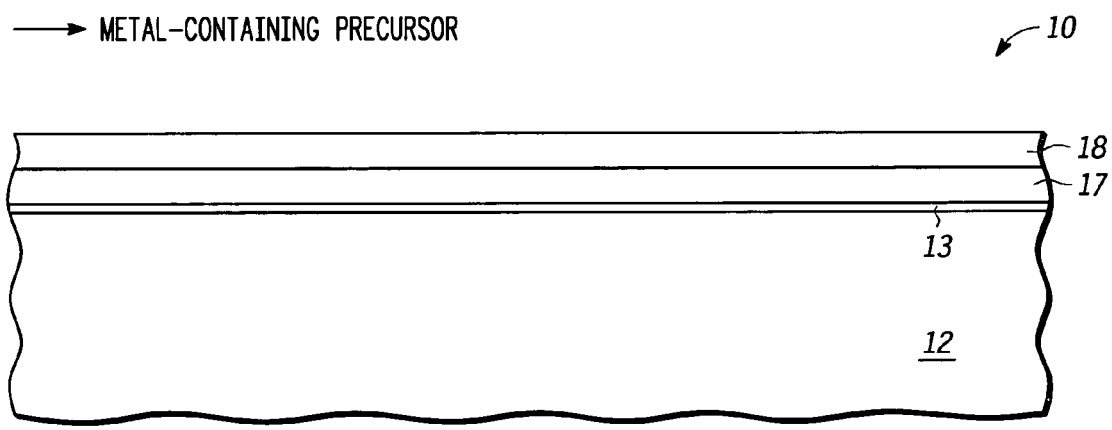
FIGS. 5–9 illustrate, in cross-sectional views, a method for forming a metal-containing layer over the high K dielectric layer in accordance with one embodiment of the present invention.

FIGS. 5–9 illustrate, in cross-sectional views, a method for forming a metal-containing layer over a high K dielectric layer in accordance with one embodiment of the present invention. Note that, in FIGS. 5–8, high K dielectric layer 17 corresponds to the resulting layer after an appropriate number of pulsing and purging cycles have been completed as described in reference to FIGS. 1–4. Therefore, note that high K dielectric layer 17 may be a metal-oxide layer (the example used in reference to FIGS. 1–4) or any other compound-containing layer 17, as was described above in reference to metal-oxide layer 16. FIG. 5 illustrates semiconductor device 10 during a first precursor pulsing cycle in which a metal-containing precursor is flowed over dielectric layer 17 to form a metal-containing layer 18 over dielectric layer 17. The metal-containing precursor may include a metal halide, such as, for example, tantalum pentafluoride, titanium tetrachloride, etc. Alternatively, other metal-containing precursors may be used, such as, for example, metal alkoxides, metal amidos, metal alkyls, etc. Note also that the metal-containing precursor may be deuterated such that deuterium is incorporated during the precursor pulsing cycle.

Figure 6:
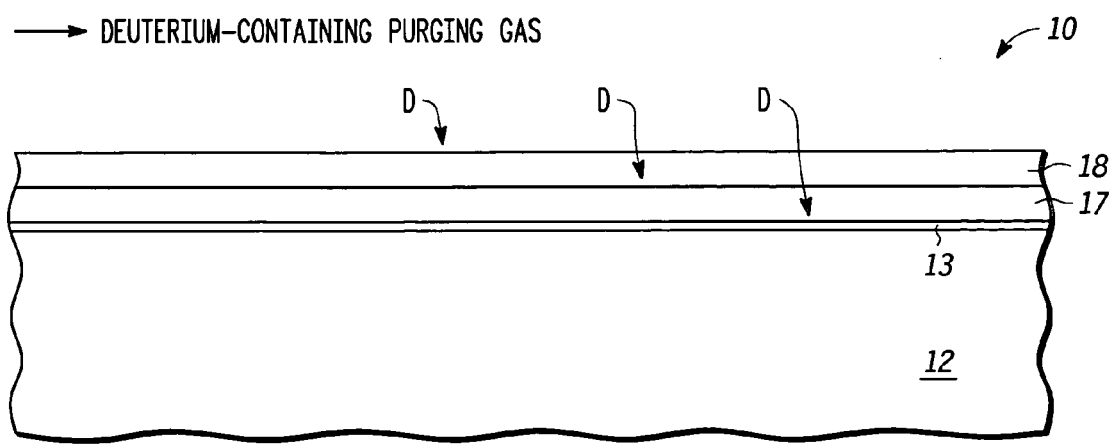

FIG. 6 illustrates the semiconductor device of FIG. 5 after a first purging cycle in which a deuterium-containing purging gas is flowed over metal-containing layer 18. (Note that this first purging cycle is performed after completing the first precursor pulsing cycle.) The purging gas purges the metal precursor by removing any remaining unreacted metal precursor. This purging gas may therefore include, for example, nitrogen, argon, helium, or other inert gases. Alternatively, the purging gas may include hydrogen. As illustrated in FIG. 6, the purging gas also includes deuterium which, during the purge, may be incorporated into metal-containing layer 18, the interface between metal-containing layer 18 and dielectric layer 17, the interface between dielectric layer 17 and interfacial layer 13, or the interface between interfacial layer 13 and substrate 12, or at a subset or all of these places. In one embodiment, the incorporated deuterium helps to passivate dangling bonds in the various interfaces between layers.

Figure 7:
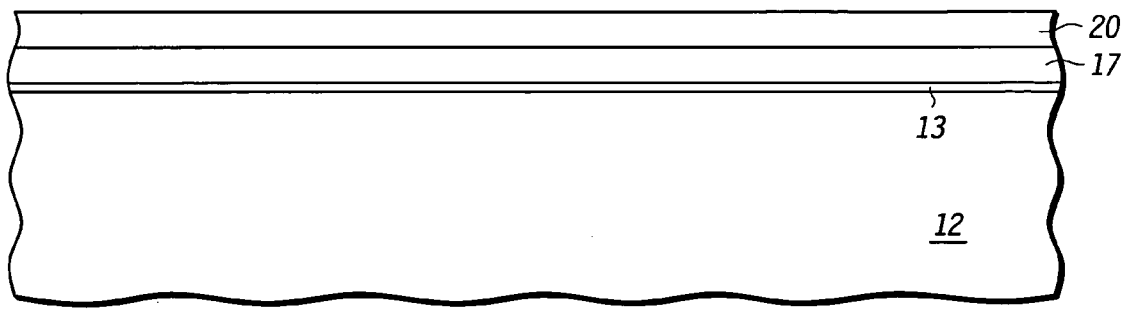

FIG. 7 illustrates the semiconductor device of FIG. 6 after a second precursor pulsing cycle in which a compound-forming precursor is flowed over metal-containing layer 18 to form a metal compound-containing layer 20. In one embodiment, the compound-forming precursor may include, for example, a compound which reacts with the metal of metal-containing layer 18 to convert metal-containing layer 18 to metal compound-containing layer 20. For example, the compound-forming precursor may include a carbon-containing gas such as methane, ethane, acetylene, etc. to form a metal carbide layer 20. Alternatively, the compound-forming precursor may include a nitrogen-containing gas such as ammonia, etc. to form a metal nitride layer 20. In yet another alternate embodiment, the compound-forming precursor may include an oxygen plasma to form a conductive metal oxide layer 20. In yet another alternate embodiment, the compound-forming precursor may include boron hexafluoride, or other boron-containing gases in order to form a metal boride layer 20. In flowing the compound-forming precursor, the compound in the precursor reacts with the metal in metal-containing layer 18, thus forming conductive metal-oxide layer 20 and volatile by-products. For example, in the example provided above in which tantalum pentafluoride is used to form metal-containing layer 18 as a tantalum pentafluoride layer and in which methane is used as the compound-forming precursor, the tantalum in metal-containing layer 18 reacts with the carbon in the methane (thus converting the tantalum pentafluoride layer to a tantalum carbide layer) and fluorine and hydrogen volatile by-products are created. In one embodiment, a plasma may be introduced with the methane in order to enhance reactivity of the methane.

Note that in an alternate embodiment, rather than using a compound-forming precursor, a reducing gas may be used to reduce the metal-containing precursor to form a metal layer, where, in this embodiment, layer 18 is a metal-containing layer rather than a metal compound-containing layer. For example, if tantalum pentafluoride is used as the first metal-containing precursor (in FIG. 5) and a hydrogen or deuterium plasma is used as the reducing gas, a tantalum metal layer 18 is formed.

Figure 8:
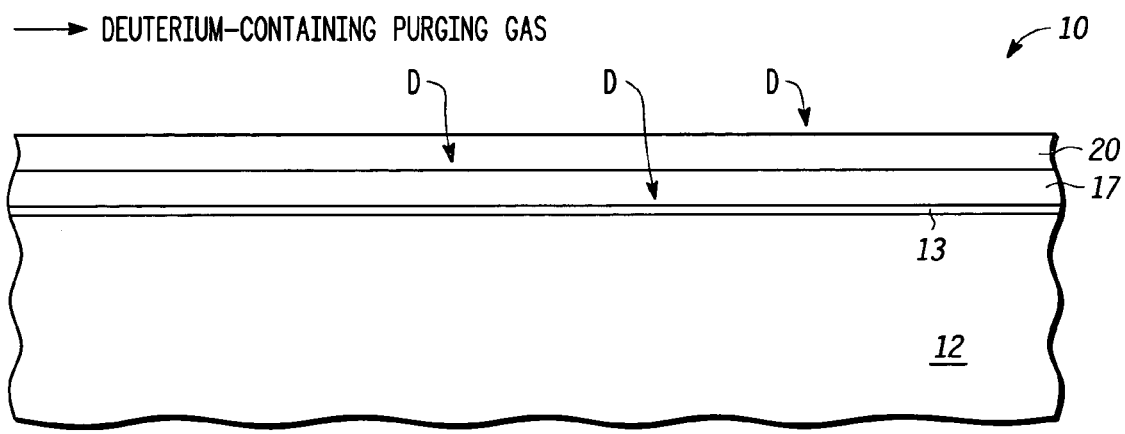

FIG. 8 illustrates the semiconductor device of FIG. 7 after a second purging cycle in which a deuterium-containing purging gas is flowed over metal compound-containing layer 20. (Note that this second purging cycle is performed after completing the second precursor pulsing cycle.) The purging gas is used to remove the volatile by-products created during formation of metal compound-containing layer 20. This purging gas may therefore include, for example, nitrogen, argon, helium, or other inert gases. Alternatively, the purging gas may include hydrogen. As illustrated in FIG. 8, the purging gas also includes deuterium which, during the purge, may be incorporated into metal compound-containing layer 20, the interface between metal compound-containing layer 20 and metal-oxide layer 17, the interface between dielectric layer 17 and interfacial layer 13, or the interface between interfacial layer 13 and substrate 12, or at a subset or all of these places. In one embodiment, the incorporated deuterium helps to passivate dangling bonds in the various interfaces between layers. Note that in one embodiment, the purging gas used in second purging cycle of FIG. 8 is the same as the purging gas used in the first purging cycle of FIG. 6. Furthermore, note that this purging gas of FIGS. 8 and 6 may be the same purging gas used in the first and second purging cycles of FIGS. 2 and 4 described above. In an alternate embodiment, the purging gas of first purging cycle of FIG. 6 may be different from that used in the second purging cycle of FIG. 8.

Figure 9:
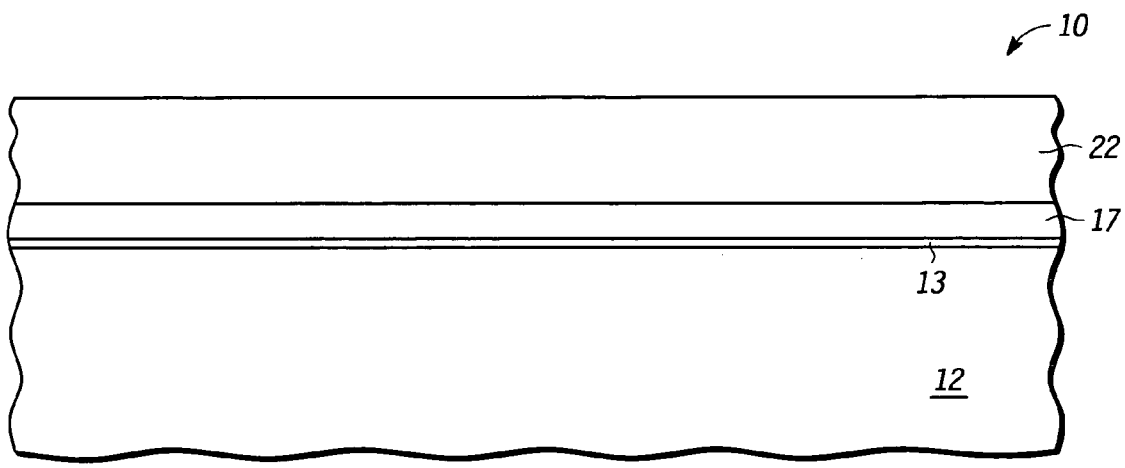

The precursor/purging cycles of FIGS. 5–8 may be repeated as many times as necessary until a desired thickness of the final metal-containing layer is achieved. For example, FIG. 9 illustrates the semiconductor device of FIG. 8 after a desired number of precursor/purging cycles have been completed to form a metal-containing layer 22 of a desired thickness. In one embodiment, this final thickness is in a range of approximately 1 nanometer to 20 nanometers, or, more preferable, 4 to 10 nanometers.

Note that the use of deuterium in the purging gases allows for an increased amount of deuterium incorporation during formation of a metal-containing layer, such as during the formation of a metal gate layer. This increased amount of deuterium helps improve passivation which may therefore result in improved reliability of the resulting semiconductor device. Also, one reason for using deuterium rather than hydrogen during the processing of films or layers (e.g. metal compound-containing layer 20) that are formed on top of a metal oxide dielectric (e.g. high K dielectric layer 17) may be that if hydrogen is used then the hydrogen can chemically replace the deuterium in the previously formed underlying layer (e.g. high K dielectric layer 17). If this occurs then the device enhancement achieved by incorporating deuterium during the processing of the underlying layer (e.g. high K dielectric layer 17) can be undone. Therefore, by capping the underlying layer using deuterium-containing precursor gases, there is no hydrogen present to chemically substitute for the deuterium.

Note that in an alternate embodiment, metal compound-containing layer 20 can be formed via reactive sputtering where the reactive sputtering can be performed in deuterium containing ambients such as, for example, $Ar/C_xD_{2x-2}$ or $Ar/ND_3$ gas mixtures. Note also that in an alternate embodiment, deuterium may be used in only the purging gas of the first or second purging cycles of FIGS. 6 and 8. In this embodiment in which only one of the first or second purging cycles includes deuterium, a lesser amount of deuterium may be incorporated. However, this embodiment may still allow for improved reliability of the resulting semiconductor device.

Figure 10:
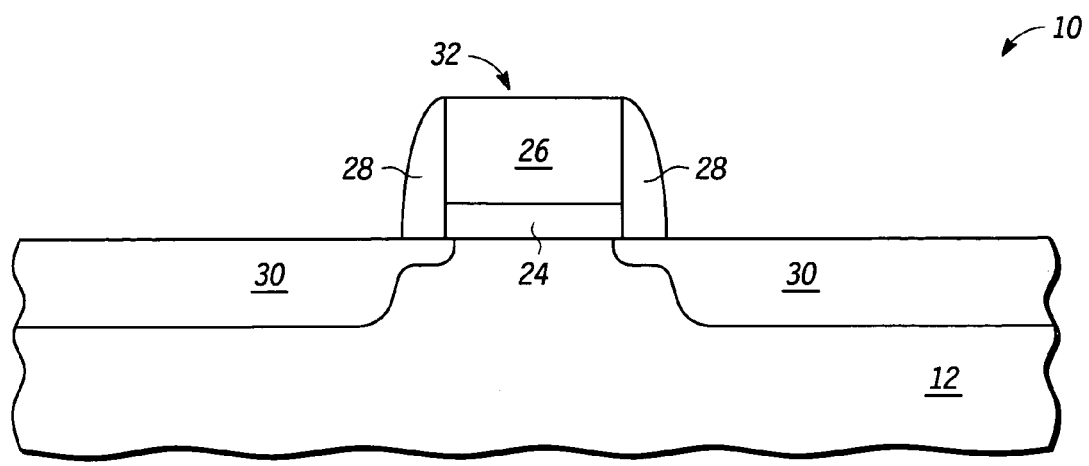
FIG. 10 illustrates, in a cross-sectional view, a substantially completed semiconductor device in accordance with one embodiment of the present invention.

FIG. 10 illustrates a semiconductor device formed using the pulsing/purging cycles described above. For example, the stack of FIG. 9 may be patterned and etched using conventional processes to form gate dielectric 24 (from dielectric layer 17) and gate electrode 26 (from metal-containing layer 22). Note that other layers may be included in the gate stack in addition to gate dielectric 24 and gate electrode 26. Conventional processing may then be used to form source/drain regions 30 and spacers 28 to form a substantially completed semiconductor device 32. Note that with the incorporation of deuterium during the purging cycles during the formation of gate dielectric 24 and gate electrode 26, improved reliability may be achieved due to the passivation of dangling bonds by the deuterium.

In one embodiment, a same temperature may be used for the pulsing/purging cycles used to form the high K dielectric layer and the metal gate layer. In one embodiment, this temperature may be in a range of approximately 200 to 700 degrees Celsius, or, more preferable 300 to 500 degrees Celsius. In an alternate embodiment, the temperature during the purging cycles may differ from the temperature used during the pulsing cycles. For example, during the purging cycles, a higher temperature in a range of approximately 250 to 500 degrees Celsius, or, more preferable 300 to 450 degrees Celsius.

Therefore, it can be appreciated how deuterium may be used in the purging cycles in order to improve device reliability. For example, the purging and pulsing cycles described above may be part of an ALD process used to form the high K dielectric layer and the metal-containing layer. Therefore, in the embodiments described above, the purging cycles, in addition to purging remaining volatile by-products, also allows for the incorporation of deuterium in the layer being formed and/or at the interface of various layers. This incorporation of deuterium may passivate dangling bonds and thus result in improved device reliability, such as, for example, reduced mobility degradation, improved Vt stability, and improved charge trapping.

Although the invention has been described with respect to specific conductivity types or polarity of potentials, skilled artisans appreciated that conductivity types and polarities of potentials may be reversed.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for forming at least a portion of a semiconductor device, comprising:
    providing a semiconductor substrate;
    flowing a first precursor gas over the substrate to form a first metal-containing layer overlying the semiconductor substrate; and
    after completing said step of flowing the first precursor gas, flowing a first deuterium-containing purging gas over the first metal-containing layer to incorporate deuterium into the first metal-containing layer and to also purge the first precursor gas.

2. A method as in claim 1, wherein the first deuterium-containing purging gas comprises at least one of nitrogen, argon, or helium.

3. A method as in claim 1, wherein the first deuterium-containing purging gas comprises hydrogen.

4. A method as in claim 1, wherein the first deuterium-containing purging gas comprises plasma.

5. A method as in claim 1, wherein the first precursor gas comprises at least one of hafnium, zirconium, silicon, lanthanum, titanium, tantalum, molybdenum, iridium, tungsten, or ruthenium.

6. A method as in claim 1, further comprising:
    flowing a second precursor gas over the first metal-containing layer to react with the first metal-containing layer to form a metal compound-containing layer; and
    flowing a second deuterium-containing purging gas over the metal compound-containing layer to incorporate deuterium into the metal compound-containing layer and to also purge the second precursor gas.

7. A method as in claim 6, wherein the first deuterium-containing purging gas and the second deuterium-containing purging gas are a same gas.

8. A method as in claim 6, wherein the second deuterium-containing purging gas comprises at least one of nitrogen, argon, or helium.

9. A method as in claim 6, wherein the second deuterium-containing purging gas comprises plasma.

10. A method as in claim 6, wherein the second precursor gas comprises at least one of deuterium oxide, deuterium peroxide, hydrogen oxide, hydrogen peroxide, ozone, methane, deuterated methane, ammonia, or deuterated ammonia.

11. A method as in claim 1, wherein the first metal-containing layer is conductive.

12. A method as in claim 1, wherein the first metal-containing layer is non-conductive.

13. A method as in claim 12, wherein the first metal-containing layer comprises a dielectric having a dielectric constant greater than 4.

14. A method as in claim 12, further comprising:
    before said step of flowing a first precursor gas, forming an interfacial layer between the substrate and the first metal-containing layer.

15. A method as in claim 14, wherein the interfacial layer is non-conductive and comprises at least one of an oxide or a nitride.

16. A method for forming at least a portion of a semiconductor device, comprising:
    providing a semiconductor substrate;
    flowing a first precursor gas over the substrate to form a first metal-containing layer on the semiconductor substrate;
    flowing a first deuterium-containing purging gas over the first metal-containing layer to incorporate deuterium into the first metal-containing layer and to also purge the first precursor gas;
    flowing a second precursor gas over the first metal-containing layer to react with the first metal-containing layer to form a metal compound-containing layer; and
    flowing a second deuterium-containing purging gas over the metal compound-containing layer to incorporate deuterium into the metal compound-containing layer and to also purge the second precursor gas.

17. A method as in claim 16, wherein each step is repeated at least once.

18. At least a portion of a semiconductor device, comprising:
    a semiconductor substrate; and
    a metal compound-containing layer overlying the semiconductor substrate,
    wherein a minimum concentration of deuterium in the metal compound-containing layer is greater than $1.7 \times 10^{20}$ atoms/cm$^3$.

19. At least the portion of the semiconductor device as in claim 18, further comprising:
    an interfacial layer between the substrate and the metal compound-containing layer, wherein a minimum concentration of deuterium in the interfacial layer is greater than $2.6 \times 10^{20}$ atoms/cm$^3$.

* * * * *